United States Patent [19]
Tamaki et al.

[11] Patent Number: 5,318,668
[45] Date of Patent: Jun. 7, 1994

[54] DRY ETCHING METHOD

[75] Inventors: Tokuhiko Tamaki; Shinichi Imai, both of Osaka; Tadashi Kimura, Hyogo; Yoshimasa Inamoto, Kyoto, all of Japan

[73] Assignee: Matsushita Electric Industrial Co., Ltd., Osaka, Japan

[21] Appl. No.: 963,637

[22] Filed: Oct. 20, 1992

[30] Foreign Application Priority Data

Oct. 24, 1991 [JP] Japan ................... 3-277417

[51] Int. Cl.$^5$ ........................... H01L 21/00
[52] U.S. Cl. ..................... 156/662; 156/643; 156/646; 156/657
[58] Field of Search ............... 156/643, 646, 662, 657

[56] References Cited

FOREIGN PATENT DOCUMENTS

| | | |
|---|---|---|
| 01017857 | 1/1989 | Japan . |
| 2-60943 | 3/1990 | Japan . |
| 2-271614 | 7/1990 | Japan . |
| 2-262334 | 10/1990 | Japan . |
| 3-22532 | 1/1991 | Japan . |
| 03041199 | 2/1991 | Japan . |
| 03293726 | 12/1991 | Japan . |

OTHER PUBLICATIONS

"Highly Selective Etching of $Si_3N_4$ to $SiO_2$ Employing Fluorine and Chlorine Atoms Generated by Microwave Discharge", J. Electrochem. Soc.; vol. 136; No. 7; Jul. 1989; pp. 2032-2034.

Primary Examiner—William A. Powell
Assistant Examiner—George Goudreau
Attorney, Agent, or Firm—Willian Brinks Hofer Gilson & Lione

[57] ABSTRACT

The invention provides an improved dry etching method for selectively etching a silicon nitride layer 3 formed on the surface of a $SiO_2$ layer 2 formed on a p-type semiconductor substrate, the method comprising the steps of supplying a mixed gas of HBr and $ClF_3$ to a reaction chamber wherein $SiBr_4$, caused, during the dry etching, by a reaction of the silicon nitride layer 3 and the HBr contained in the mixed gas, partly deposits on an etching wall of the p-type semiconductor substrate 1 while at the same time an excess of the $SiBr_4$ reacts, between the p-type semiconductor substrate 1 and a wall of the reaction chamber, with the $ClF_3$ contained in the mixed gas to produce a fluoride. The fluoride thus produced can be easily discharged to the outside, since it is more volatile.

4 Claims, 7 Drawing Sheets

○ SiBr$_4$
● ClF$_3$
⊗ SiBr$_x$F$_y$

DRY ETCHING METHOD

BACKGROUND OF THE INVENTION

This invention generally relates to dry etching methods, and it particularly pertains to a dry etching method for selectively dry etching a silicon nitride layer which is formed through an intermediate, underlying layer such as a silicon oxide layer ($SiO_2$) on the surface of a semiconductor substrate.

Conventional dry etching methods have employed a carbon-containing gas as a main etching gas such as $CF_4$, $CH_2F_2$, and $CH_3F$, in selectively etching a silicon nitride layer formed on the surface of an underlying $SiO_2$ layer as well as in at the same time ensuring etch-selectivity to the $SiO_2$ layer (International Electron Devices Meeting 1983, Technical Digest, pp. 757–759, by T. Kure et al.).

Such a carbon-containing main etching gas, however, presents a problem. The presence of carbon in a main etching gas accelerates the reaction of the main etching gas and the $SiO_2$ layer. This results in the decline of etch-selectivity, that is, the ratio of the etch rates of the silicon nitride layer and the $SiO_2$ layer.

Japanese Pat. Appln. published under No. 2-262334 proposes a technique that uses a mixed gas of $NF_3$ and $Cl_2$ as a main etching gas. Japanese Pat. Appln. published under No. 2-66943 shows another technique that uses $ClF_3$ as a main etching gas. The use of such main etching gases without containing carbon has the effect of controlling the etching of a $SiO_2$ layer, which is detailed in Japanese Pat. Appln. published under No. 3-22532.

None of these main etching gases, however, contain a CH group, so that no passivation films, of polymer, for protecting an etching wall are formed. As a result, the amount of CD loss (i.e., the value obtained by a subtraction of the resist pattern size prior to an etching process minus the silicon nitride layer pattern size after the etching process) becomes roughly equal to the thickness of the silicon nitride layer, 0.1–0.2 μm. They are therefore not a suitable main etching gas for silicon nitride layers of semiconductor memories not less than 16M DRAM.

As a solution to the above problem, Japanese Pat. Appln. published under No. 2-271614 discloses a method of using a mixed gas of $NF_3$ and HBr, and Japanese Pat. Appln. published under No. 3-22532 shows another method of using a mixed gas of HBr and $O_2$.

In accordance with these methods, $SiBr_4$ with a less volatility, produced by the reaction of HBr in the mixed gas and Si contained in a Silicon nitride layer of a semiconductor substrate, is forced to deposit on an etching sidewall to protect it, as in a phenomenon taking place at the time of etching to a polysilicon layer described in U.S. Pat. No. 4,490,209. Thus an anisotropic etching can be realized thanks to the protection of an etching sidewall.

For the etching of a silicon nitride layer with HBr, a reaction product, $SiBr_4$ will deposit on the walls of a reaction chamber, as in the etching of a polysilicon layer with HBr. Therefore, the deposits on the walls peel off to form dust particles. This presents another problem that the yield of semiconductor device declines.

An effective method to control the deposition of $SiBr_4$ on the walls of a reaction chamber is known, which controls the temperature of a reaction chamber wall in the 50°–100° C. range. It is however not practical at all to keep the entire wall at such a high temperature range. For this reason, when etching a silicon nitride layer with HBr, it is not possible to control the generation of dust particles.

SUMMARY OF THE INVENTION

It is therefore an aim of the present invention to provide an improved dry etching method so that $SiBr_4$, produced by the reaction of HBr and Si, will not adhere to the walls of a reaction chamber, although it uses HBr to etch a silicon nitride layer.

The present invention makes use of advantageous characteristics of an interhalogen, $ClF_3$. The Cl—F bond has a weak binding energy, 253 Kj/mol, which is easily broken to intensely fluorinate other materials. The fact that even non-plasma $ClF_3$ has a property of reacting with Si at room temperature can be understood from U.S. Pat. No. 4,998,979 in which $ClF_3$ is proposed as a cleaning gas used in periodically removing a film formed on the walls of a reaction chamber of a CVD (Chemical Vapor Deposition) system for forming a thin film to a silicon or silicon carbide.

Based on the above knowledge, the present invention was made. In the invention, HBr is mixed with $ClF_3$ so that $SiBr_4$, resulting from the reaction of HBr contained in the mixed gas and Si of a semiconductor substrate, reacts with $ClF_3$ to produce a fluoride. Such a fluoride can be discharged easily because it is more volatile.

More specifically, the present invention is directed to a dry etching method for selectively etching a silicon nitride layer formed on the surface of a semiconductor substrate placed in a reaction chamber. The dry etching method of the invention comprises the steps of: (a) supplying a mixed gas of HBr and $ClF_3$ to the reaction chamber for the selective dry etching of the silicon nitride layer whereby a part of $SiBr_4$, produced, during the dry etching, by a reaction of the silicon nitride layer and the HBr contained in the mixed gas, deposits on an etching wall of the semiconductor substrate while at the same time an excess of the $SiBr_4$ reacts, between the semiconductor substrate and a wall of the reaction chamber, with the $ClF_3$ contained in the mixed gas to produce a fluoride, and (b) discharging the fluoride thus produced to the outside.

As described above, a mixed gas of HBr and $ClF_3$ is supplied to a reaction chamber for the dry etching of a silicon nitride layer so that Si of the silicon nitride layer reacts with HBr in the mixed gas whereby producing a reaction product, $SiBr_4$ which is less volatile. By letting the resulting $SiBr_4$ deposit on the etching walls of a semiconductor substrate, an anisotropic etching can be realized. Unfortunately, the resulting $SiBr_4$ itself, however, is also a cause of dust particles.

Arranging the bonding energy between Si and halogen in the order of strength, they are the Si—F bond, the Si—Cl bond, and the Si—Br bond: Si—F bond > Si—Cl bond > Si—Br bond, and $SiBr_4$ has a strong property to react with $ClF_3$ to be fluorinated. Because of this, an excess of $SiBr_4$ easily reacts with $ClF_3$ in the mixed gas between the semiconductor substrate and the reaction chamber wall to produce a fluoride which is more volatile. Accordingly, it is easy to discharge such a fluoride from the reaction chamber to the outside.

In the case of the dry etching of a silicon nitride layer by a mixed gas of HBr and $ClF_3$, $SiBr_4$ generated over the surface of a semiconductor substrate (FIG. 5) deposits on an etching sidewall in the vicinity of the surface of the semiconductor substrate, without having reacted with $ClF_3$ while another $SiBr_4$ reacts with $ClF_3$ and is fluorinated before reaching the reaction chamber wall so that a fluoride, $SiBr_XF_Y (X+Y=4, Y>0)$ is generated.

$SiBr_4$, which boils at 153° C., is less volatile so that it would adhere to the reaction chamber walls as a deposit, however, as shown in FIG. 6, it ($SiBr_4$) reacts with $ClF_3$ between the semiconductor substrate and the reaching chamber wall to form $SiBr_2F_2$. This $SiBr_2F_2$ is discharged through an outlet to the outside without adhering to the walls, since it is more volatile. FIG. 7 shows a relation between the boiling point of $SiCl_XF_Y$ $(X+Y=4)$ and Y (i.e., the degree of fluorination), as a reference.

The use of a mixed gas of $ClF_3$ and HBr prevents $SiBr_4$ (a reaction product with a less volatility), generated due to the use of HBr, from reaching the walls of a reaction chamber. Therefore, no deposits are formed on the walls, although HBr is used as an etching gas.

The present invention realizes a dry etching method for a silicon nitride layer wherein it is possible to perform an anisotropic etching capable of achieving a lower CD loss as well as to control the generation of dust particle at the same time. The dry etching method of the invention can comply with semiconductor devices that have been becoming tinier and thinner in recent years.

In the case that the silicon nitride layer is formed on the surface of a $SiO_2$ layer formed on a semiconductor substrate, the instant dry etching method can ensure a preferable etch-selectivity of the silicon nitride layer to the $SiO_2$ layer.

In the case that the ratio of HBr to $ClF_3$ of the above mixed gas is about 1:1, $SiBr_4$ will not adhere to the walls of a reaction chamber even though a dry etching is carried out at room temperature.

DETAILED DESCRIPTION OF THE INVENTION

Figure 1A:
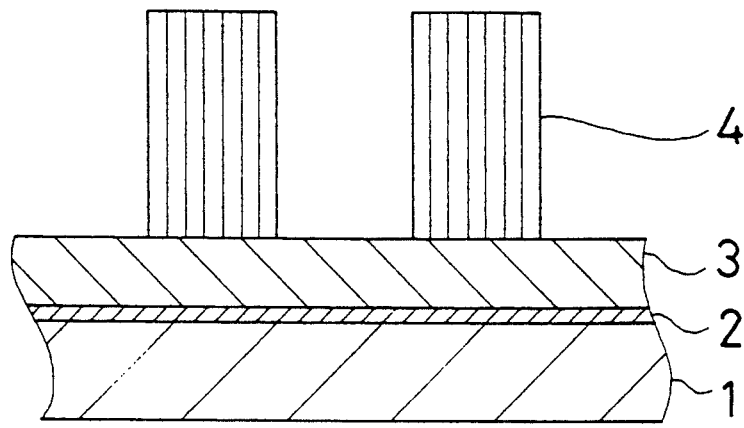
FIG. 1, comprised of (a), (b), and (c), illustrates steps of a dry etching method of an embodiment of the present invention, in cross section.
Figure 1B:
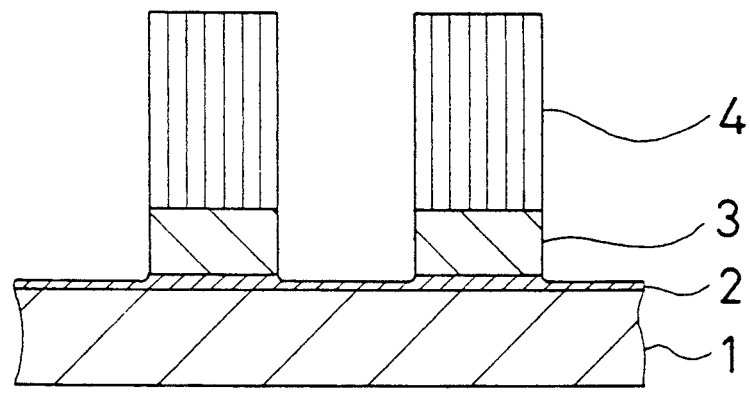

FIG. 1, comprised of (a), (b), and (c), illustrates, in cross section, the steps of a dry etching method of a silicon nitride layer of an embodiment of the present invention.

As shown in FIG. 1(a), a silicon oxide layer 2 by thermal oxidation with a thickness of 8 nm is grown on a silicon substrate 1 of p-type (i.e., a semiconductor substrate). Then, a silicon nitride layer 3 with a thickness of 150 nm is deposited upon the surface of the silicon oxide layer 2 by the LPCVD (Low Pressure Chemical Vapor Deposition) method. Next, resist patterns 4, which have a pattern width of 0.35 μm and are spaced at intervals of 0.35 μm, are prepared on the silicon nitride layer 3.

Following is the placement of the p-type silicon substrate 1 on a sample stand of a dry etching system. Then, the silicon nitride layer 3 is dry etched. As the dry etching system, a parallel-plate-type RIE (Reactive Ion Etching) system is employed. The following etching conditions, shown in TABLE, are used. The etch rate of the silicon nitride layer 3 is 100 nm/min, and the etch-selectivity of the silicon nitride layer 3 to the silicon oxide layer 2 is 5:1. When the silicon nitride layer 3 is 15% over etched, the pre-process thickness of the silicon oxide layer 2, 8 nm is reduced to 4 nm.

TABLE

| | |
|---|---|
| $ClF_3$ | 20 sccm |
| HBr | 20 sccm |
| Etch Pressure | 150 m Torr |
| Sample Stand Application RF Power | 150 W |
| Etch Time | 150 sec |
| Stage Temperature | 20° C. |

Two types of gases are shown in TABLE, wherein $ClF_3$ works as a main etching gas while HBr is a shape-control gas. The use of $ClF_3$ alone results in an isotropic etching, however, the addition of HBr to it at an appropriate flow rate achieves a vertical etching, that is, an anisotropic etching.

Figure 2:
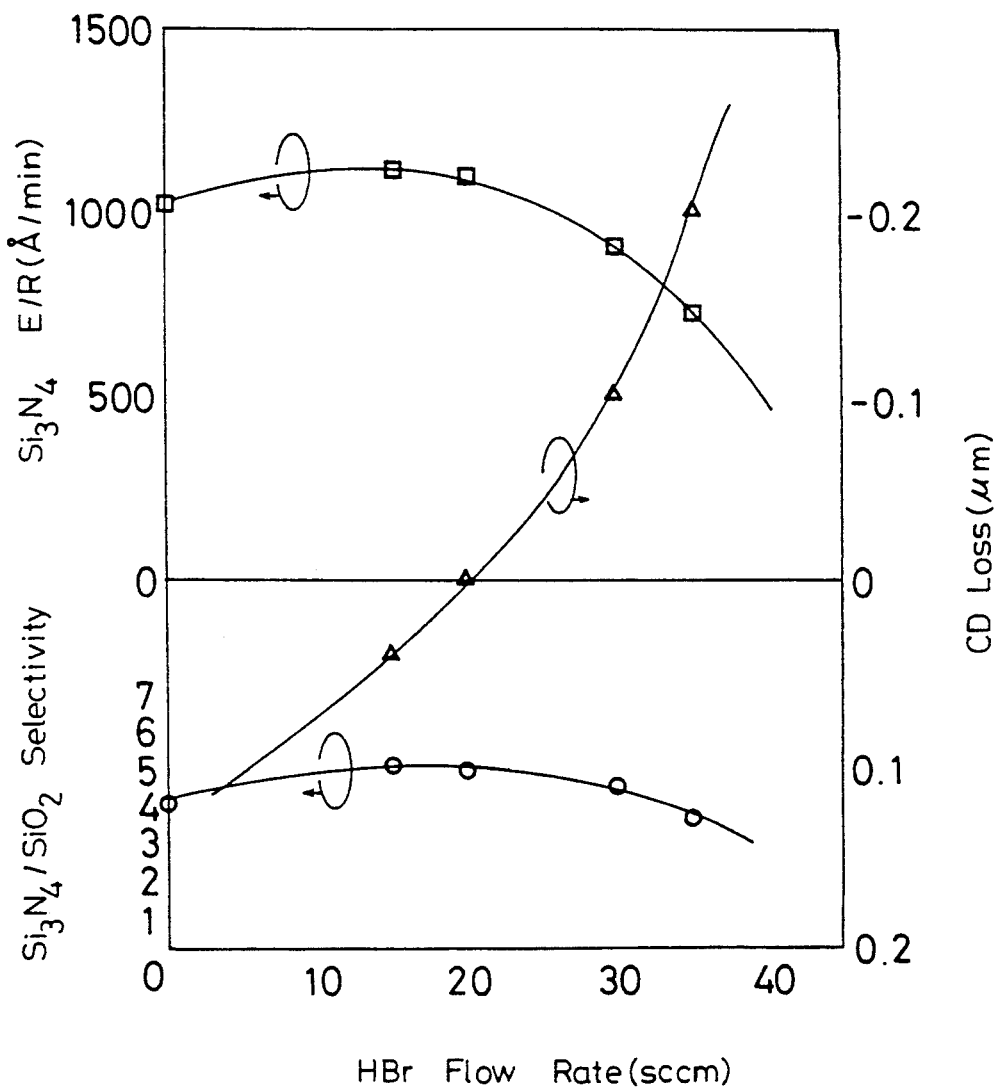
FIG. 2 is a graph showing relations between the etch rate of the silicon nitride layer, the silicon nitride layer/$SiO_2$ layer etch-selectivity, the amount of CD loss of the silicon nitride layer, and the amount of additive HBr, in the case that $ClF_3$ is used as a main etching gas.

FIG. 2 is a graph showing relations between the etch rate of the silicon nitride layer 3, the silicon nitride layer 3/silicon oxide layer 2 etch-selectivity, the amount of CD loss obtained by a subtraction of the pattern size of the resist 4 prior to an etching process minus that of the silicon nitride layer 3 after the etching process, and the amount of additive HBr. As seen from FIG. 2, the increase of HBr accompanies the generation of less volatile $SiBr_4$ due to the reaction with the silicon nitride layer 3. As the resultant $SiBr_4$ deposits on the etching sidewalls, the amount of CD loss approaches zero (if the flow rate of HBr=20 sccm, the amount of CD loss is below 0.01 μm). If the flow rate of HBr is further increased, the etching shape will become an upwardly tapered shape (i.e., a mesa), and the amount of CD loss will become greater in the negative value direction. The silicon nitride layer/silicon oxide layer etch-selectivity has a maximum value at a certain amount of additive HBr. In the present embodiment, the amount of additive HBr (the flow rate of HBr: 20 sccm) is chosen so that the amount of CD loss is minimized. Then the silicon nitride layer/silicon oxide layer etch-selectivity also becomes about a maximum value.

When carrying out an etching process under the conditions of TABLE, no deposits were formed on the walls of a reaction chamber. This is because that even though a reaction product (i.e., less volatile $SiBr_4$) is produced due to the use of HBr, it ($SiBr_4$) reacts with the existing $ClF_3$ between the p-type silicon substrate 1 and the walls of the reaction chamber to form a fluoride.

Figure 3:
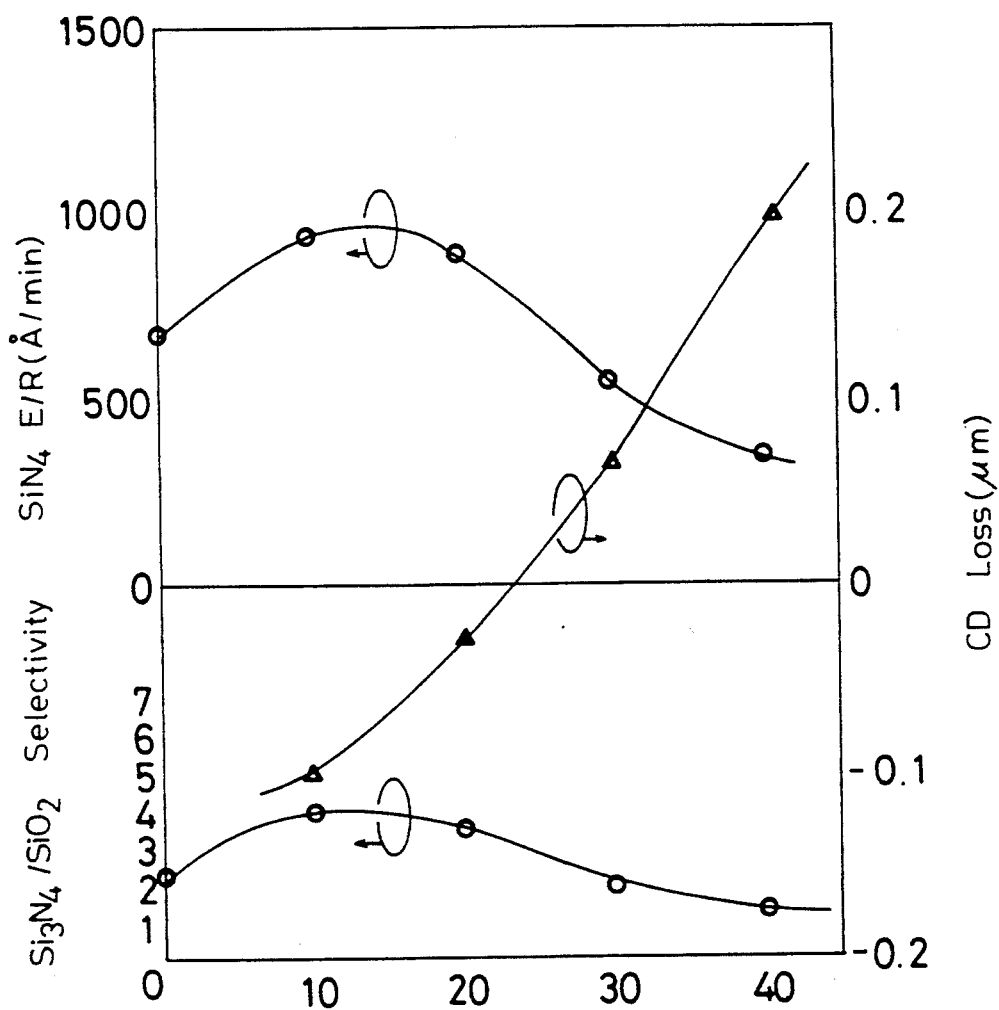
FIG. 3 is a graph showing relations between the etch rate of the silicon nitride layer, the silicon nitride layer/$SiO_2$ layer etch-selectivity, the amount of CD loss of the silicon nitride layer, and the amount of additive HBr, in the case that $SF_6$ is used as a main etching gas.

FIG. 3 is a graph similar to the one of FIG. 2 but differs from it in that $SF_6$ is used instead of $ClF_3$. $SF_6$ has the same characteristics as $ClF_3$ in that the etch-selectivity has a maximum value, although the etch rate decreases, along with the silicon nitride layer/silicon oxide layer etch-selectivity in the case of $SF_6$.

The use of $SF_6$ as a main etching gas, however, presents a drawback that deposition occurs on the walls of a reaction chamber, since $SF_6$ does not have a reactivity to fluorinate $SiBr_4$ before it reaches the walls.

Figure 4:
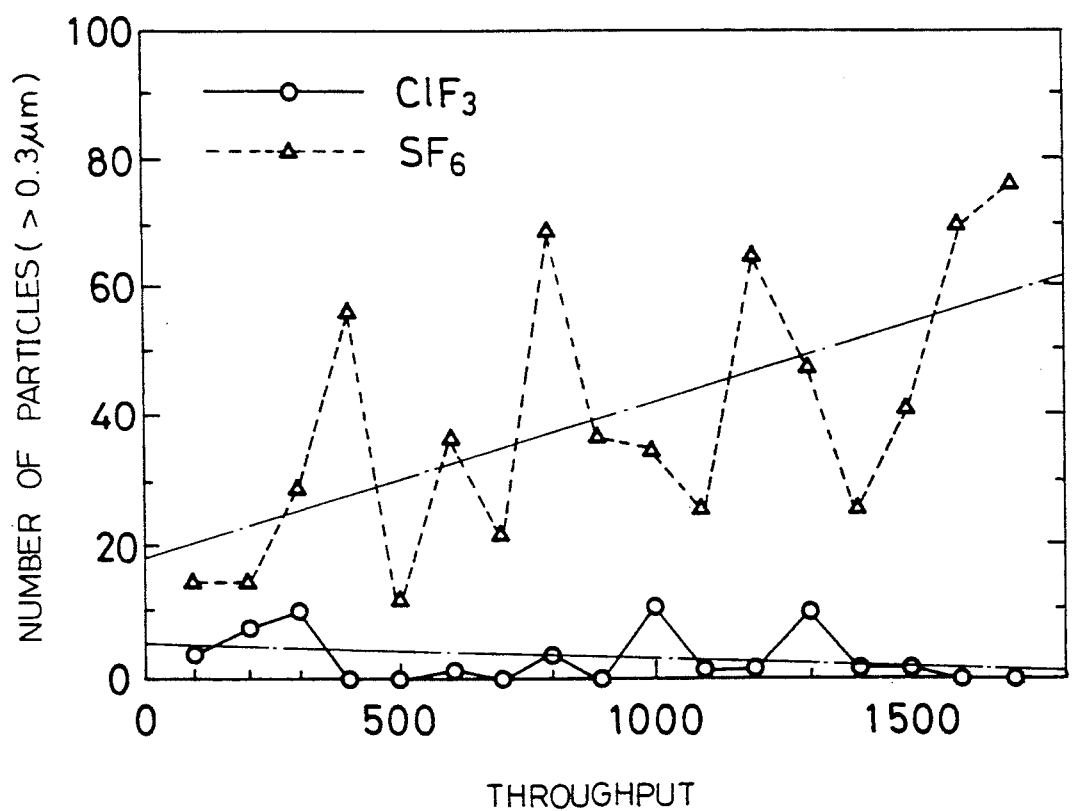
FIG. 4 is a graph showing a relation between the throughput, and the total number of dust particles (with particles diameters of 0.3 μm or larger) adhered to the surface of a 6 in. wafer (values by actual measurement and their approximation straight lines), in the cases that $ClF_3$ and $SF_6$ are respectively used as a main etching gas.
Figure 5:
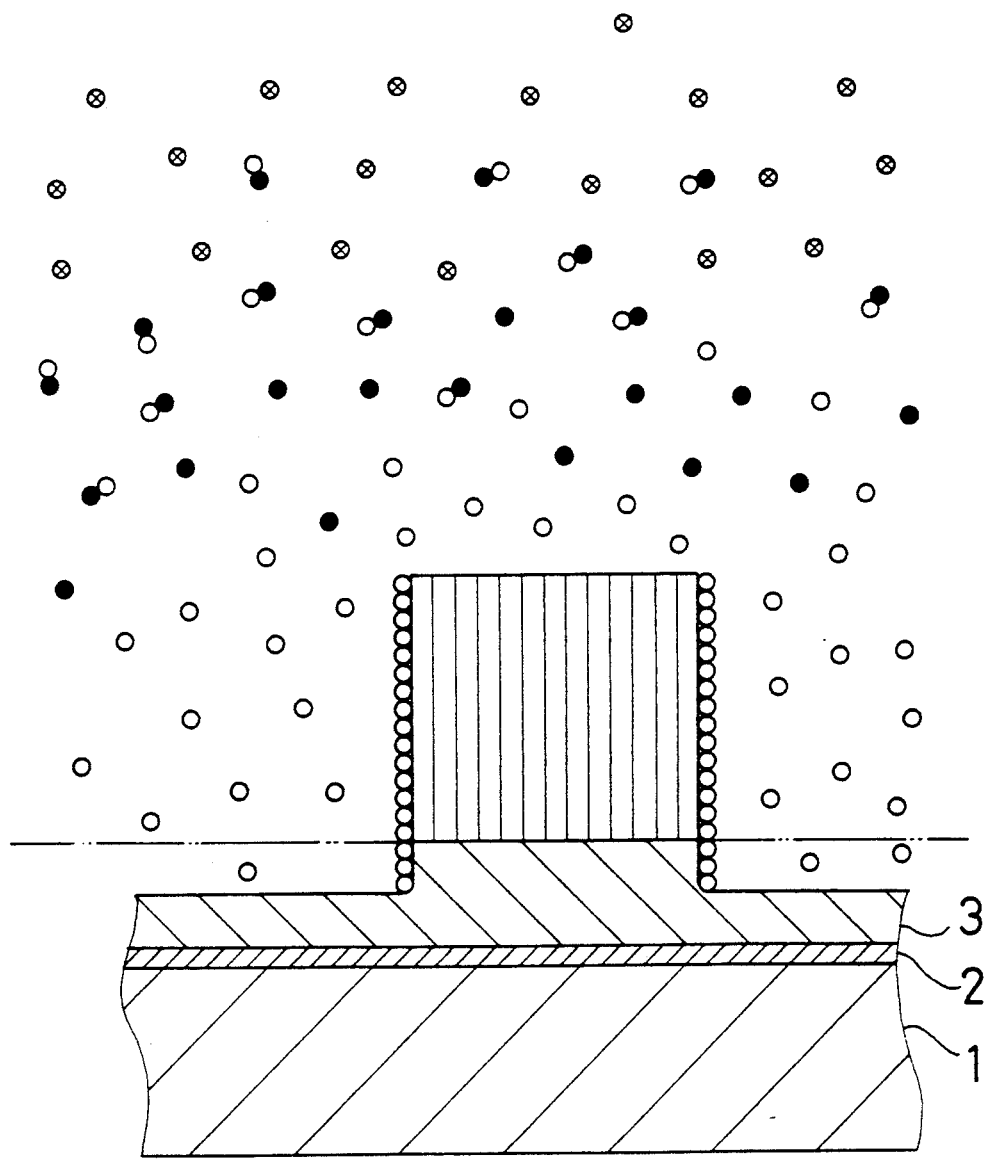
FIG. 5 is a sketch depicting how $SiBr_4$, which is produced during the dry etching process, deposits on the sidewalls of a semiconductor substrate, and further showing how an excess of $SiBr_4$ reacts with $ClF_3$ to produce a fluoride.
Figure 6:
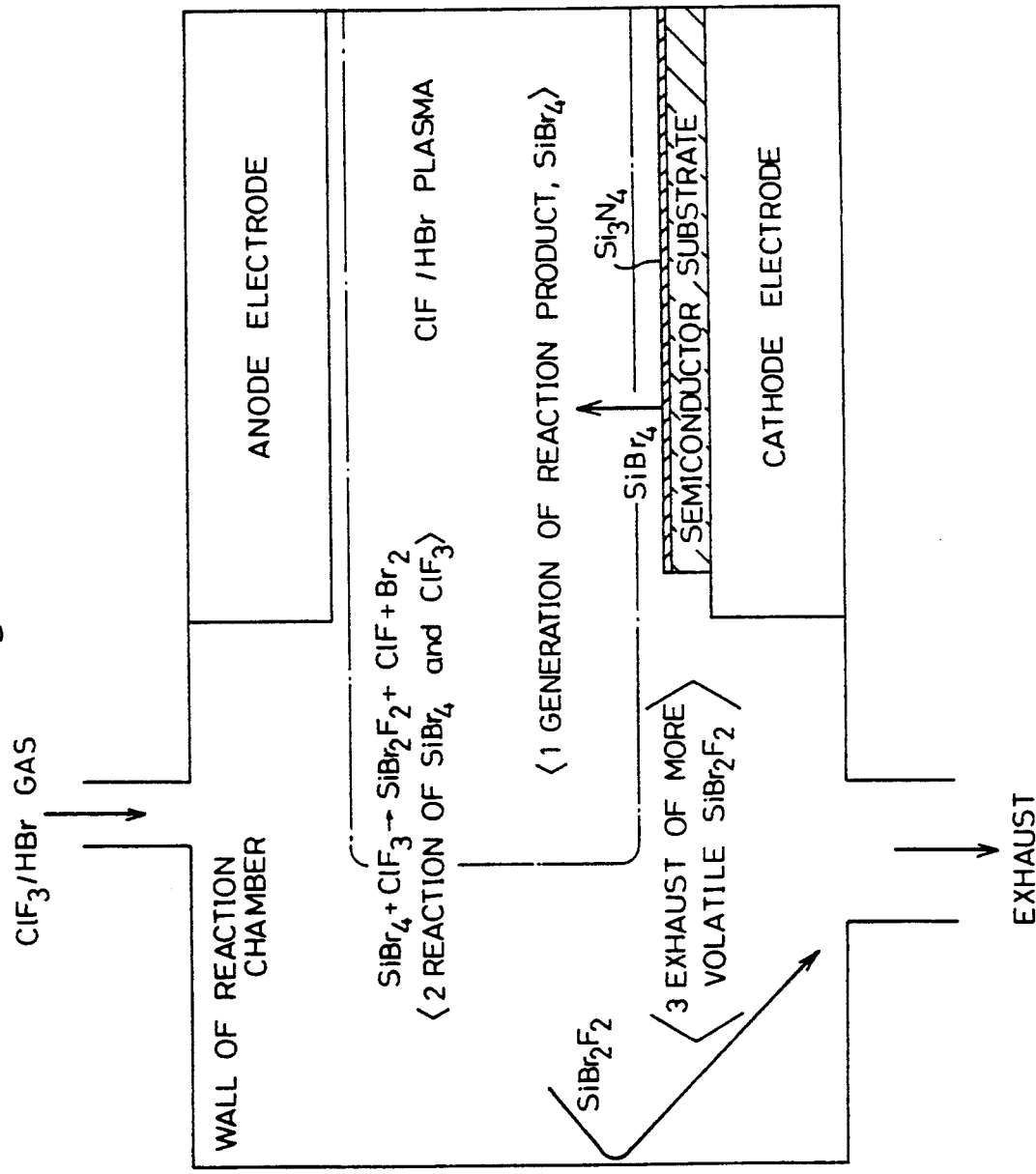
FIG. 6 is a diagram showing how $ClF_3$ prevents deposition, due to HBr, on the walls of a reaction chamber.
Figure 7:
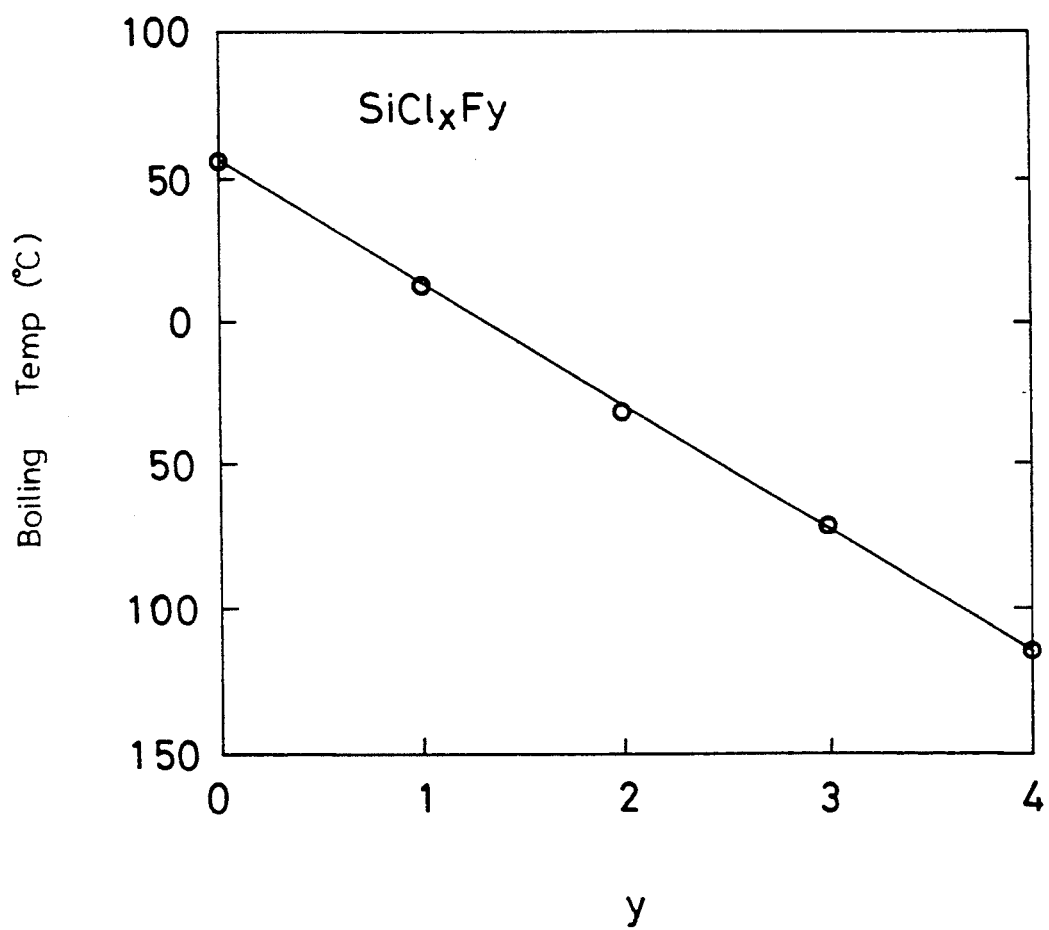
FIG. 7 is a graph showing a relation between the boiling point of $SiCl_XF_Y (X+Y=4)$ and Y.

FIG. 4 is a graph showing a relation between the throughput and the total number of dust particles (with particles diameters of 0.3 μm or larger) adhered to the surface of a 6 in. wafer due to deposits on the walls of a reaction chamber, in the cases that $ClF_3$ and $SF_6$ are respectively used as a main etching gas. FIG. 4 shows values by actual measurement and their approximation straight lines (alternate long and short dash lines). It is clearly understood from FIG. 4 that the number of dust particles increases as the throughput increases, in the case that $SF_6$ serves as a main gas, whereas on the other hand the number of dust particles decreases as the throughput increases when using $ClF_3$ as a main gas. The use of $ClF_3$ as a main etching gas prevents possible deposition on the walls of a chamber, as a result of which the throughput can be increased without the increase of dust particles.

When $SF_6$ is employed as a main etching gas, it is possible to control the generation of deposits by temperature control of the walls of a reaction chamber (at a temperature of 70° C.). It is, however, unpractical to keep the entire wall of a reaction chamber at a high temperature. The number of dust particles cannot be controlled, accordingly.

Although the use of other interhalogens such as $BrF_5$ and $IF_3$ as a main etching gas may make it possible to control the generation of deposits on the walls of a reaction chamber, $ClF_3$ is most preferable because it has a strongest reactivity.

Figure 1C:
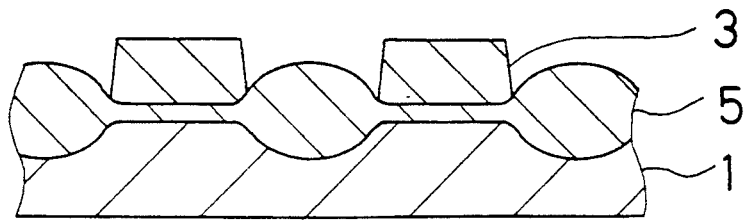

After removing the resist pattern 4, shown in FIG. 1(c), selective oxidation is performed by using the silicon nitride layer 3, which has undergone patterning, as a mask, to form an intercomponent separation field oxide layer 5. Then the silicon nitride layer 3 is removed to form a semiconductor component by a well known technique.

The dry etching method of the embodiment of the invention described above uses a mixed gas of HBr and $ClF_3$. A reaction product, less volatile $SiBr_4$ due to the use of HBr of a shape-control gas is fluorinated by a main etching gas $ClF_3$ to improve its volatility, so that the generation of deposits on the reaction chamber walls due to $SiBr_4$ can be avoided. In this way, the generation of dust particles is controlled, so that a preferable dry etching can be realized, which is able to control the silicon nitride layer/silicon oxide layer etch-selectivity, the anisotropic etching shape (low CD loss), and the generation of dust particles.

A PPE system, a triode-type RIE system, a magnetron RIE system, a high frequency RIE system (RF: above 20 MHz), or ECR-type plasma system may be used to obtain the same effects as a parallel-plate-type RIE system which is used in the embodiment of the present invention, provided that the gas ratio and other conditions are optimized.

Further, the embodiment of the invention uses an LPCVD silicon nitride layer as a material to be etched, and a silicon nitride layer as a selective oxidation mask. The present invention, however, may be applicable to a case where different types of silicon nitride layer such as a plasma CVD silicon nitride layer are used as materials to be etched.

What is claimed is:

1. A dry etching method for dry etching a silicon nitride layer formed on the surface of a semiconductor substrate placed in a reaction chamber comprising the steps of:

supplying a mixed gas of HBr and $ClF_3$ to the reaction chamber for dry etching the silicon nitride layer whereby a part of $SiBr_4$, produced during the dry etching by a reaction of the silicon nitride layer and the HBr contained in the mixed gas, deposits on an etching wall of the semiconductor substrate while at the same time an excess of the $SiBr_4$ reacts, between the semiconductor substrate and a wall of the reaction chamber, with the $ClF_3$ contained in the mixed gas to produce a fluoride, and discharging the fluoride thus produced from the reaction chamber to the outside thereof so as to prevent deposits of $SiBr_4$ from forming on the wall of the reaction chamber.

2. The dry etching method of claim 1, wherein the silicon nitride layer is formed on a silicon oxide layer formed on the semiconductor substrate.

3. The dry etching method of claim 1, wherein the ratio of the HBr and the $ClF_3$ in the mixed gas is about 1:1.

4. The dry etching method of claim 2, wherein the ratio of the HBr and the $ClF_3$ in the mixed gas is about 1:1.

* * * * *